(12) United States Patent
Boehm et al.

(10) Patent No.: US 8,930,070 B2
(45) Date of Patent: Jan. 6, 2015

(54) METHOD FOR DETERMINING THE CHARGE STATE OF A BATTERY PACK

(75) Inventors: Andre Boehm, Kornwestheim (DE); Stefan Soboll, Dachau (DE); Sven Gaebler, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 285 days.

(21) Appl. No.: 13/516,739

(22) PCT Filed: Oct. 28, 2010

(86) PCT No.: PCT/EP2010/066343
§ 371 (c)(1),
(2), (4) Date: Sep. 12, 2012

(87) PCT Pub. No.: WO2011/079977
PCT Pub. Date: Jul. 7, 2011

(65) Prior Publication Data
US 2012/0330503 A1 Dec. 27, 2012

(30) Foreign Application Priority Data
Dec. 18, 2009 (DE) .......................... 10 2009 054 924

(51) Int. Cl.
*G06F 11/30* (2006.01)
*G01N 27/416* (2006.01)
*G01R 31/36* (2006.01)

(52) U.S. Cl.
CPC ........ *G01R 31/3606* (2013.01); *G01R 31/3651* (2013.01)
USPC ........................................ 701/34.4; 324/434

(58) Field of Classification Search
USPC ............................ 701/34.4; 702/63; 320/132; 324/426–434
See application file for complete search history.

(56) References Cited

U.S. PATENT DOCUMENTS

| | | | |
|---|---|---|---|
| 2002/0101243 A1* | 8/2002 | Mentgen et al. | 324/427 |
| 2006/0091863 A1 | 5/2006 | Melichar | |
| 2009/0189613 A1 | 7/2009 | Plett | |

FOREIGN PATENT DOCUMENTS

| | | |
|---|---|---|
| DE | 698 10 731 T2 | 11/2003 |
| DE | 10 2006 033 629 A1 | 1/2008 |
| JP | 2000-152264 A | 5/2000 |
| JP | 2001-153935 A | 6/2001 |
| KR | 2001-0059122 A | 7/2001 |

OTHER PUBLICATIONS

International Search Report corresponding to PCT Application No. PCT/EP2010/066343, mailed Nov. 15, 2011 (German and English language document) (5 pages).

\* cited by examiner

*Primary Examiner* — Fadey Jabr
*Assistant Examiner* — Aaron L. Troost
(74) *Attorney, Agent, or Firm* — Maginot, Moore & Beck LLP

(57) ABSTRACT

A method for determining the charge state of a battery pack consisting of a number "N" of individual battery cells, includes determining the charge state of each individual battery cell SOCi for all i=1,N. The mean value of the charge states of the individual battery cells, mean (SOCi), is also determined. The method further includes determining a weighting "w" from the equation where w=gw(mean (SOCi)). The following applies for the function gw(SOC): the function value tends towards a minimum value of wmin when the argument tends toward the minimum charge state of a complete discharge SOCmin. The function value tends toward a maximum value of wmax when the argument tends towards the maximum charge state of a complete charge SOCmax; and the function gw( ) is continuous.

8 Claims, 5 Drawing Sheets

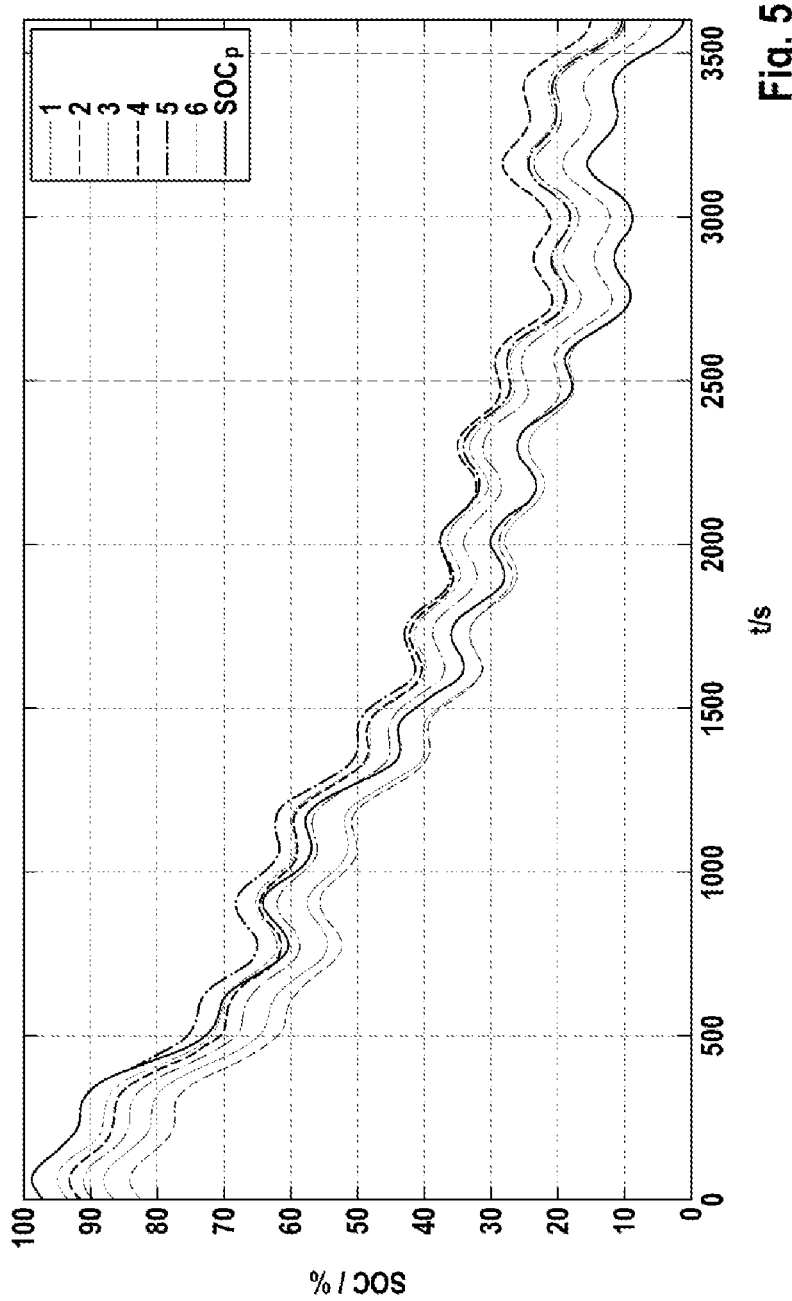

METHOD FOR DETERMINING THE CHARGE STATE OF A BATTERY PACK

This application is a 35 U.S.C. §371 National Stage Application of PCT/EP2010/066343, filed on Oct. 28, 2010, which claims the benefit of priority to Serial No. DE 10 2009 054 924.2, filed on Dec. 18, 2009 in Germany, the disclosures of which are incorporated herein by reference in their entirety.

BACKGROUND

The disclosure is based on a method for determination of the state of charge of a battery pack which consists of a plurality of individual battery cells. The subject matter of the present disclosure also covers a battery system consisting of a lithium-ion battery pack and a battery management system which operates on the basis of the above method, as well as a motor vehicle which contains a battery system consisting of a lithium-ion battery pack and a corresponding battery management system. The subject matter of the disclosure furthermore covers a computer program, which carries out all the steps of the method according to the disclosure when it is run on a computation appliance.

In many applications, for example in hybrid or electric vehicles, electrical energy which is stored in a battery is used as an energy source. It is critical for the operation of a battery such as this in this case to be able to determine the state that the battery is in and the capacity that it has for further operation. For this purpose, the operation of the battery is managed by means of a battery management system BMS. Inter alia, this battery management system determines the state of charge SOC for each individual cell. The state of charge may in this case vary between complete discharge and complete charge.

Battery packs based on lithium-ion or NiMH technology are used in hybrid and electric vehicles, consisting of a large number of electrochemical cells connected in series and/or in parallel. The battery management system is used to monitor the battery and, in addition to safety monitoring, is also intended to ensure as long a life as possible.

The states of charge of the individual battery cells within the battery pack may in some circumstances differ considerably. However, the indication of a single, valid and representative state of charge value is necessary for superordinate controllers or for indicating the state of charge to the user.

It is known from the prior art for the mean value of the states of charge of the individual battery cells to be output. This is associated with the problem that individual cells could be overcharged if the mean state of charge is still below 100%, that is to say below the maximum state of charge of complete charge. Individual cells can likewise be undercharged if the mean SOC is still above 0%, that is to say above the minimum state of charge for complete discharge. One disadvantage in this case is that undercharging or overcharging of electrochemical battery cells can lead to accelerated aging or else to damage to the battery cells. In the extreme case, this may result in a battery fire or explosion.

It is also known for the maximum and minimum value of the individual battery cells to be specified. Overcharging and uncharging can be avoided by evaluation of the two values. However, the handling of two values is associated with complications, for example in the indication of the total state of charge or in the indication or determination of the remaining life or of the available capacity. Furthermore, sudden changes when changing from one value to the other are unavoidable.

Furthermore, it is known for the maximum value of the individual battery cells to be quoted for high states of charge, and for the minimum value of the individual battery cells to be quoted for low states of charge. However, one disadvantage in this case is that the battery pack state of charge changes suddenly and discontinuously at the threshold value, which can lead to a behavior which cannot be calculated, to a behavior which cannot be understood, or to sudden changes in state of charge indications.

SUMMARY

According to the disclosure a method is proposed for determination of the state of charge of a battery pack consisting of a number "N" of individual battery cells, which comprises the following steps: first of all, the state of charge of each individual battery cell $SOC_i$ is determined for all $i=1,N$, wherein the battery state of charge varies between a minimum state of charge of complete discharging $SOC_{min}$ and a maximum state of charge of complete charging $SOC_{max}$. In a second step, the mean value of the states of charge of the individual battery cells mean($SOC_i$) is determined. This is followed by determination of a weighting "w" of the maximum battery state of charge of a battery cell in the battery pack max($SOC_i$) and/or of a weighting (1-w) of the minimum battery state of charge of a battery cell in the battery pack (min($SOC_i$)) from the equation where:

$$w = gw(\text{mean}(SOC_i))$$

wherein, for the function gw(SOC):
1. the function value tends to a minimum value of $w_{min}$ when its argument tends to the minimum state of charge of complete discharge $SOC_{min}$;
2. the function value tends to a maximum value of $w_{max}$ when its argument tends to the maximum state of charge of complete charge $SOC_{max}$; and
3. the function gw( ) is continuous.

Finally, the state of charge of the overall battery pack $SOC_p$ is calculated as a function of the value of the weighting w, of the maximum battery state of charge of a battery cell in the battery pack max($SOC_i$) and of the minimum battery state of charge of a battery cell in the battery pack min($SOC_i$), using the following equation:

$$SOC_p = w/(w_{max} - w_{min}) * \max(SOC_i) + (1 - w/(w_{max} - W_{min})) * \min(SOC_i).$$

The method according to the disclosure advantageously allows a single, representative and valid state of charge to be determined easily for the overall battery pack. The individual maximum and minimum states of charge are in this case weighted in such a manner that the maximum single-cell state of charge dominates for high states of charge, while in contrast the minimum single-cell state of charge dominates for low states of charge. In this case, the transition between the minimum value and the maximum value is carried out continuously, without any discontinuities, by the specific configuration of the weighting function gw( ).

The measures stated in the dependent claims allow advantageous developments and improvements of the method specified in the independent claim.

In the following text, the state of charge values are used in a range from 0 to 100, with the value "0" corresponding to the state of charge "0%" of complete discharge, and "100" corresponding to the state of charge "100%" of complete charge. However, this subdivision is not restrictive. It is evident to a person skilled in the art that it is also possible to use a value range, for example, from 0 to 1. The functions mentioned below must then be correspondingly rescaled.

For example, in a first exemplary embodiment, the weighting function gw( ) comprises the hyperbolic tangent function. The weighting function is preferably:

$$gw(SOC)=[0.5*(1+\tan h(\alpha*(SOC-50)))]^p$$

for all state of charge values SOC in the range from 0 to 100, and "α" is variable with α>0, and "p" is an element of the natural numbers.

The specific configuration of the weighting function allows a transition from the minimum value "0" to the maximum value "1" in the central value range of the state of charge around the value "50", which corresponds to a state of charge of 50%. In this case, the function is point-symmetrical with respect to this central value. The variable "α" makes it possible to set the desired width of the transition between the minimum value and the maximum value. A high value of the variable "α" allows a more rapid change between the minimum value and the maximum value than a lower value. Particularly preferably, the exponential value is p=1. However, it may also be chosen to be higher in order in turn to accelerate the change in the weighting between the maximum single-cell state of charge and the minimum single-cell state of charge in the overall state of charge.

In a second exemplary embodiment, the weighting function gw( ) comprises the sigmoid function. The weighting function is then preferably given by:

$$gw(SOC)=[1/(1+e^{-\alpha*(soc-50)})]^p,$$

for all state of charge values SOC in the range from 0 to 100, and "α" is variable with α>0, and "p" is an element of the natural numbers.

The sigmoid function has the advantage over the hyperbolic tangent that its value range varies directly between the desired values of "0" and "1", and need not first of all be shifted. The hyperbolic tangent varies between the values "−1" and "1". The specific configuration of the weighting function allows a transition from the minimum value "0" to the maximum value "1" in the central value range of the state of charge at the value "50", which corresponds to a state of charge of 50%. In this case, the function is point-symmetrical with respect to this central value. The variable "α" makes it possible to set the desired width of the transition between the minimum value and the maximum value. A high value of the variable "α" allows a more rapid change between the minimum value and the maximum value than a lower value. Particularly preferably, the exponential value is p=1. However, it may also be chosen to be higher in order in turn to accelerate the change in the weighting between the maximum single-cell state of charge and the minimum single-cell state of charge in the overall state of charge.

In a third exemplary embodiment, the weighting function consists of individual linear functions, which are defined for different section values of the state of charge. Preferably, for the weighting function gw(SOC), for all SOC in the range from 0 to 100:

SOC[0;X]:gw(SOC)=0;
SOC[X;Y]:gw(SOC)=(SOC−X)/(Y−X);
SOC[Y;100]:gw(SOC)=1.

The specific configuration of the weighting function as a function which is linear in places allows very simple implementation of the requirements for the weighting function. The magnitude of the state of charge values X and Y in this case governs the position and size of the transition between the minimum value and the maximum value.

The values X and Y are preferably chosen to be symmetrical about the mean state of charge. This allows a possible representation and output of the state of charge value.

In one preferred exemplary embodiment, the value X corresponds to a state of charge of 20%, that is to say X=20. The value Y in this case corresponds to a state of charge of 80%, that is to say Y=80. This ensures that the state of charge is represented as decreasing or increasing linearly in the central range, with the extreme ranges of complete discharge and charge being output as such at an early stage, in order to prevent danger. Values between 0 and 1 may also, of course, be used instead of 0 and 100, with appropriate rescaling. A percentage value may also be used directly, once again with appropriate rescaling of the equations.

A computer program is likewise specified, which carries out all the steps of a method as described above when it is run on a computation appliance, such as a battery pack monitoring unit. The monitoring unit may also be arranged separately from the battery pack.

A battery management system, in particular for lithium-ion batteries, is likewise proposed, wherein the battery system comprises the above method for determination of the state of charge.

A battery system is correspondingly specified, which comprises a lithium-ion battery pack consisting of a plurality of individual battery cells and a battery management system for lithium-ion batteries, wherein the battery system comprises the above method for determination of the state of charge.

Furthermore, a motor vehicle is specified, which is equipped with a drive system which comprises a corresponding battery system according to the disclosure.

BRIEF DESCRIPTION OF THE DRAWINGS

Exemplary embodiments of the disclosure will be explained in more detail in the following description and are illustrated in the drawings, in which:

FIG. 5 shows the state of charge of the battery pack, which was calculated using the third exemplary embodiment of the disclosure.

DETAILED DESCRIPTION

Figure 1:
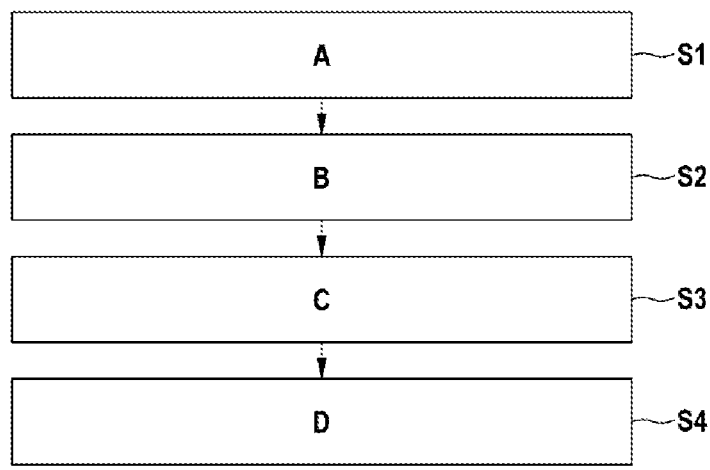
FIG. 1 shows a flowchart of the method according to the disclosure.

FIG. 1 shows a flowchart of the method according to the disclosure for determination of the state of charge of a battery pack. In the following test, the battery pack preferably consists of lithium-ion battery cells, but may also be applied to other battery types consisting of a plurality of electrochemical cells.

In FIG. 1, the letter "A" represents the "determination of $SOC_i$ for all i=1,N", the letter "B" represents the "determination of the mean value mean($SOC_i$) of all $SOC_i$"; the letter "C" represents the "determination of a weighting w=gw(mean($SOC_i$)) where gw(SOC): gw(SOC→0%)→0; gw(SOC→100%)→1; and gw( ) continuous", and the letter "D" represents the "determination of the overall state of charge of the battery pack $SOC_p$ where: $SOC_p$=w*max($SOC_i$)+(1−w)*min($SOC_i$)".

The method according to the disclosure for determination of the state of charge relates to a battery pack consisting of a number "N" of individual battery cells.

In a first step, the state of charge of each individual battery cell $SOC_i$ is determined for all i=1,N, wherein the battery state of charge varies between a minimum state of charge of complete discharge $SOC_{min}$ and a maximum state of charge of complete charge $SOC_{max}$. The minimum state of charge may, for example, have the value "0" or "0%", and the maximum state of charge may have the value "1" or "100" or "100%".

In a second step, the mean value of the states of charge of the individual battery cells $mean(SOC_i)$ is determined. The mean value is normally calculated from: $mean(SOC_i)=1/N*\Sigma_{i=1,N}SOC_i$.

In the third step, a weighting "w" is then determined for the maximum battery state of charge of a battery cell in the battery pack $max(SOC_i)$ and/or a weighting $(1-w)$ of the minimum battery state of charge of a battery cell in the battery pack $(min(SOC_i))$ using the equation $w=gw(mean(SOC_i))$, where, for the function gw(SOC):

the function value tends to a minimum value of "0" when its argument tends to the minimum state of charge of complete discharge $SOC_{min}$;

the function value tends to a maximum value of "1" when its argument tends to the maximum state of charge of complete charge $SOC_{max}$; and the function gw( ) is continuous.

In other words, a mathematical function gw=f(SOC) as a function of the state of charge SOC is used for weighting purposes, and has the following characteristics:

$$gw(SOC \to 0\%) \to 0 \quad (1),$$

$$gw(SOC \to 100\%) \to 1 \quad (2),$$

$$gw(\ ) \text{ is continuous} \quad (3).$$

The following settings were used in the above example: $w_{max}=1$ and $w_{min}=0$. In this case, it is once again evident to a person skilled in the art that the values of the minimum value "0" and of the maximum value "1" are not restrictive, but that it is also possible to use other values such as "0%" for the minimum value or "100%" or "100" for the maximum value.

Finally, in a fourth step, the step of charge of the overall battery pack $SOC_p$ is calculated as a function of the value of the weighting w, of the maximum battery state of charge of a battery cell in the battery pack $max(SOC_i)$ and of the minimum battery state of charge of a battery cell in the battery pack $min(SOC_i)$. This is done using the equation:

$$SOC_p=w*max(SOC_i)+(1-w)*min(SOC_i). \quad (4)$$

Once again, this equation is not restrictive for $w_{max}=1$ and $w_{min}=0$.

The final step can also be described as follows: the state of charge of the overall battery pack $SOC_p$ is determined as a function of the value of the weighting w, of the maximum battery state of charge of a battery cell in the battery pack $max(SOC_i)$ and of the minimum battery state of charge of a battery cell in the battery pack $min(SOC_i)$ where $SOC_p \leq max(SOC_i)$ for the weighting "w" tending to its maximum value; and $SOC_p \geq min(SOC_i)$, for the weighting "w" tending to its minimum value. The state of charge of the overall battery pack $SOC_p$ may be calculated as a linear regression from the value of the weighting w, the maximum battery state of charge of a battery cell in the battery pack $max(SOC_i)$ and the minimum battery state of charge of a battery cell in the battery pack $min(SOC_i)$.

A function which can be used advantageously for the weighting function in the first exemplary embodiment is:

$$gw(SOC)=0.5*(1+\tan h(\alpha*(SOC-50\%))) \quad (5).$$

Figure 2:
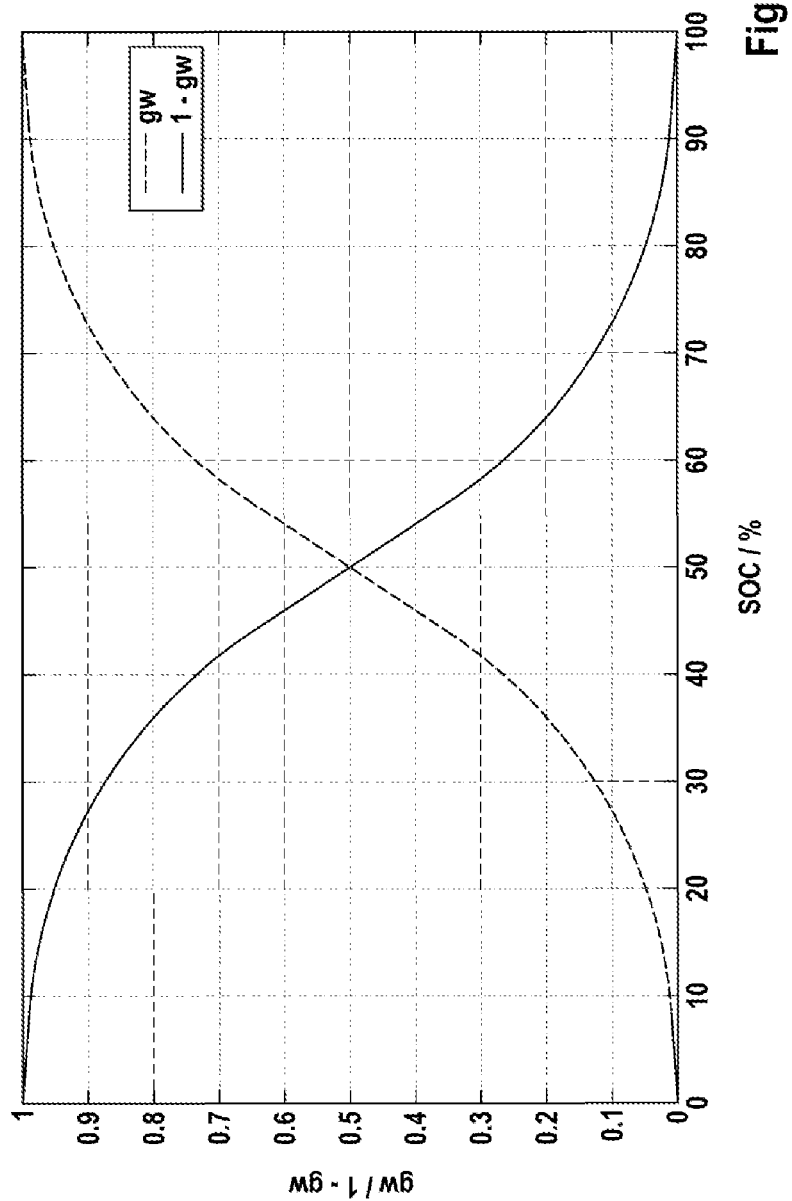
FIG. 2 shows a graph of the weighting function according to a first exemplary embodiment of the disclosure.

This complies with the stated requirements and has a transition from the minimum value "0" to the maximum value "1" in the region around 50% SOC. The width of this transition can be adjusted by means of the parameter $\alpha$. By way of example, $\alpha=1/20$ results in the profile for the function gw(SOC) as illustrated in FIG. 2. The figure additionally shows the profile of 1−gw(SOC). Because of its characteristic profile, the function can also be referred to as an "S" function or a Fermi function. In this case, a greater value of "$\alpha$" results in a faster transition between the minimum value and the maximum value.

Using this function $gw_1(SOC)$, the overall pack-SOC $SOC_p$ from the individual $SOC_i$ of the cells is calculated as follows:

$$w=gw_1(mean(SOC_i)) \quad (6)$$

$$SOC_p=w*max(SOC_i)+(1-w)min(SOC_i), \quad (7)$$

where $mean(SOC_i)$ is the mean value, $max(SOC_i)$ is the maximum value, and $min(SOC_i)$ is the minimum value of the individual cell SOCs.

In the above exemplary embodiment, the weighting function may also be the square or some other power of the equation (5). The choice of the power in turn allows a faster transition of the weighting of the maximum and minimum individual states of charge in the overall pack state of charge.

Figure 3:
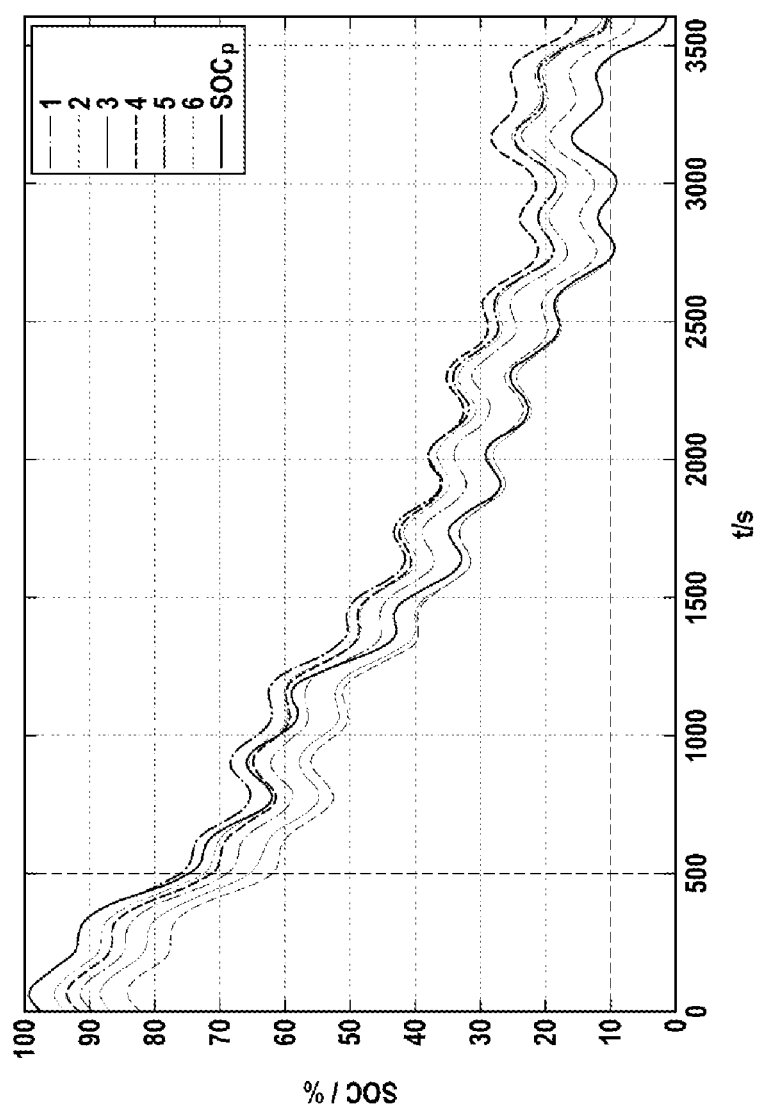
FIG. 3 shows the state of charge of the battery pack, which was calculated using the first exemplary embodiment of the disclosure.

FIG. 3 illustrates an exemplary application of the equations (5) to (7), and shows charging curves as a percentage. In this case, the battery pack consists of 6 individual cells, whose states of charge vary by about +/−10%, and which are annotated with the numbers "1" to "6" in FIG. 3. The curve for the number "1" therefore corresponds to the state of charge of the battery cell 1. Furthermore, the figure shows the curve for the overall state of charge, annotated $SOC_p$. At the start of the illustrated time profile, the cell 5 reaches a state of charge of virtually 100%. The determined overall state of charge $SOC_p$ assumes this maximum value. After approximately 1300 seconds, the mean state of charge is about 50%. The overall pack state of charge $SOC_p$ corresponds to the mean value between the maximum and the minimum single-cell states of charge. As the profile continues, the single-cell states of charge decrease further, as a result of which the overall pack state of charge $SOC_p$ assumes the state of charge value of the lowest cell, the cell 3 in the example.

In a second exemplary embodiment (not shown in the figures), the weighting function is formed from a sigmoid function, preferably from:

$$gw(SOC)=[1/(1+e^{-\alpha*(SOC-50)})]^p \quad (8)$$

for all state of charge values SOC in the range from 0 to 100, and "$\alpha$" is variable with $\alpha>0$, and "p" is an element of the natural numbers. Once again, the parameters "p" and "$\alpha$" allow a faster or slower transition of the minimum and maximum values of the weighting function, depending on their magnitude. The sigmoid function has the advantage over the hyperbolic tangent that it already produces the desired value range between "0" and "1", while the hyperbolic tangent function must first of all be shifted. Since the functions are otherwise very similar, the weighting function and the overall pack state of charge $SOC_p$ resulting therefrom will not be described any further.

Figure 4:
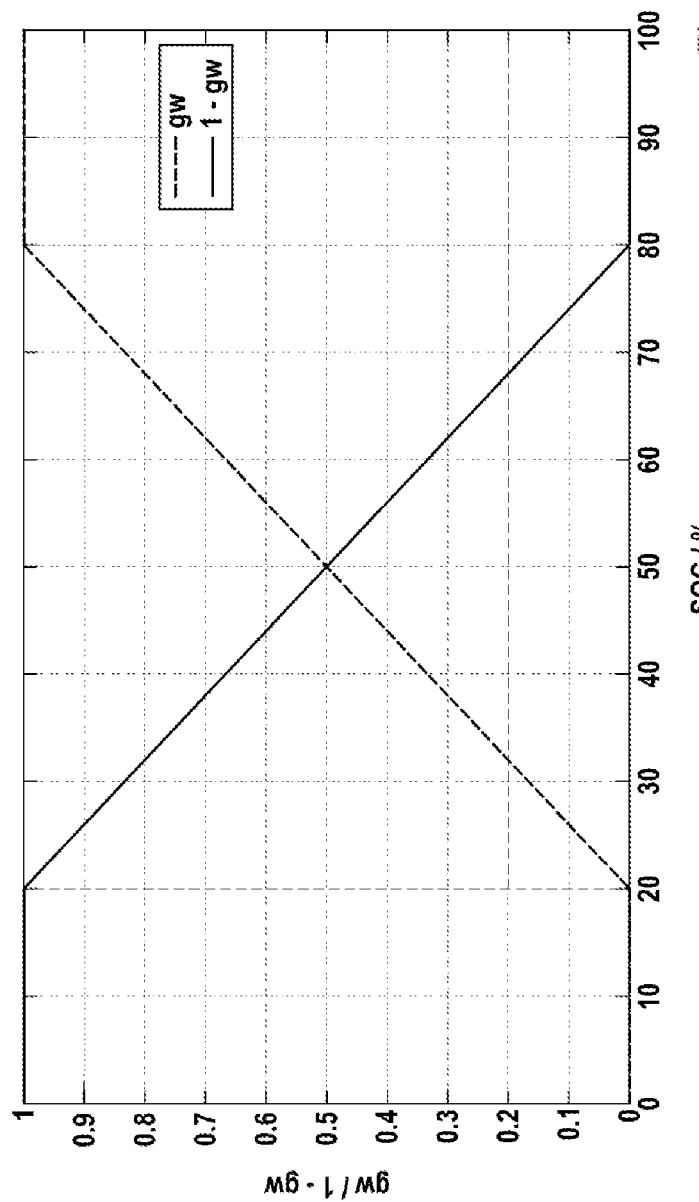
FIG. 4 shows a graph of the weighting function according to a third exemplary embodiment of the disclosure.

FIG. 4 shows an alternative weighting function gw and, at the same time, the value of 1−gw. Here, the weighting function gw was chosen as follows:

$$SOC[0-20\%]:gw(SOC)=0 \quad (9),$$

$$SOC[20-80\%]:gw(SOC)=(SOC-20)*1/60 \quad (10),$$

$$SOC[80\%-100\%]:gw(SOC)=1 \quad (11).$$

This function likewise complies with the stated requirements for the weighting function. FIG. 5 once again shows the charge curves as a percentage for six individual cells and for the overall pack $SOC_p$. As the figure shows, the changed weighting function gw is also suitable for determination of the overall pack SOC $SOC_p$. Once again, the maximum individual state of charge dominates for high states of charge, and the minimum state of charge for low states of charge, with the transition having a continuous profile.

In general, the lower and upper values of the central range may vary in the equations (9)-(11) and may assume a value of x % and y %, with the lower and upper limits being: 0<x<50 and 50<y<100:

$$SOC[0;X]:gw(SOC)=0 \quad (12)$$

$$SOC[X;Y]:gw(SOC)=(SOC-X)/(Y-X); \quad (13)$$

$$SOC[Y;100]:gw(SOC)=1. \quad (14)$$

The central range is in this case always chosen to be symmetrical with respect to the mean value of the state of charge 50%. Depending on the choice of the upper and lower limits, the transition of the weighting function between its minimum value and the maximum value in this case takes place faster (relatively small difference between x and y) or slower (relatively large difference between x and y). The above example is once again not restrictive for the minimum and maximum values "0" and "1" of the weighting. These may also be chosen differently, with appropriate rescaling of the function (7).

The method is preferably used in a battery management system for lithium-ion battery packs.

In one particularly preferred exemplary embodiment, the battery management system is used in a lithium-ion battery which is used as a drive for a motor vehicle. In this case, the battery management system can operate in a monitoring unit in the vehicle.

The invention claimed is:

1. A battery system, comprising:
a battery pack including a plurality of (N) battery cells; and
a battery management system operatively connected to the plurality of battery cells to determine an overall state of charge of the battery pack ($SOC_p$), the battery management system comprising a computation appliance configured to:
measure a state of charge (SOCi) of each battery cell in the plurality of (N) battery cells for all i=1 . . . (N) battery cells, wherein the measured state of charge varies between a predetermined minimum state of charge ($SOC_{min}$) and a predetermined maximum state of charge ($SOC_{max}$),
identify a first battery cell in the plurality of battery cells having a minimum measured state of charge (min($SOC_i$));
identify a second battery cell in the plurality of battery cells having a maximum measured state of charge (max($SOC_i$));
determine a mean value of a plurality of states of charge of the plurality of (N) battery cells (mean($SOC_i$)),
determine a first weighting ($w_{max}$) corresponding to the first battery cell with the maximum measured state of charge (max($SOC_i$)) with reference to a predetermined function (gw(SOC));
determine a second weighting ($w_{min}$) corresponding to the second battery cell with the minimum measured state of charge (min($SOC_i$)) with reference to the predetermined function (gw(SOC));
determine a third weighting (w) corresponding to the mean value of the plurality of states of charge of the plurality of (N) battery cells (mean($SOC_i$)) with reference to the predetermined function (gw(SOC));
wherein, for the predetermined function (gw(SOC)):
the predetermined function value tends to a minimum value of ($w_{min}$) when an argument (SOC) of the predetermined function (gw(SOC)) tends to the predetermined minimum state of charge ($SOC_{min}$),
the predetermined function value tends to a maximum value of ($w_{max}$) when the argument (SOC) of the predetermined function (gw(SOC)) tends to the predetermined maximum state of charge ($SOC_{max}$), and
the predetermined function (gw(SOC)) is continuous, and
wherein the battery management system determines the overall state of charge of the battery pack ($SOC_p$) with reference to the value of the first weighting ($w_{max}$), the second weighting ($w_{min}$), the third weighting (w), the maximum measured battery state of charge of the first battery cell (max($SOC_i$)), and the minimum measured battery state of charge of the second battery cell (min($SOC_i$)) in accordance with:

$$SOC_p = w/(w_{max}-w_{min})*\max(SOC_i)+(1-w/(w_{max}-w_{min}))*\min(SOC_i).$$

2. The battery system of claim 1 wherein the battery pack is operatively connected to a drive system in a motor vehicle to provide electrical power to the drive system, and the battery management system is configured to determine the overall state of charge of the battery pack ($SOC_p$) during operation of the motor vehicle.

3. The battery system of claim 1, the computation appliance in the battery management system being configured to perform the predetermined function (gw(SOC)) comprising one of:
a hyperbolic tangent function;
a sigmoid function; or
a piece-wise linear function.

4. The battery system of claim 3, the computation appliance in the battery management system being configured to perform the predetermined function (gw(SOC)) as the hyperbolic tangent function wherein:

$$gw(SOC)=[0.5*(1+\tan h(\alpha*(SOC-50)))]^p,$$

for the argument (SOC) in a predetermined range of 0 to 100,
"α" is variable where α>0, and
"p" is an element of the natural numbers.

5. The battery system of claim 3, the computation appliance in the battery management system being configured to perform the predetermined function (gw(SOC)) as the sigmoid function wherein:

$$gw(SOC)=[1/(1+e^{-\alpha*(SOC-50)})]^p,$$

for the argument (SOC) in a predetermined range of 0 to 100,
"α" is variable where α>0,
"p" is an element of the natural numbers.

6. The battery system of claim 5 wherein the computation appliance in the battery management system is configured to perform the sigmoid function with p=1.

7. The battery system of claim 3, the computation appliance in the battery management system being configured to perform the predetermined function (gw(SOC)) for the argument (SOC) as the piece-wise linear function wherein:
if the argument (SOC) is in a range of 0 to a natural number (X) ([0;X]):

$$gw(SOC)=0;$$

if the argument (SOC) is in a range of the natural number (X) to another natural number (Y) ([X;Y]): $gw(SOC) = (SOC-X)/(Y-X)$; and if the argument (SOC) is in a range of the other natural number (Y) to 100 ([Y;100]): $gw(SOC)=1$, wherein the natural number (X) and the other natural number (Y) are each greater than or equal to 0 and less than or equal to 100, and the natural number (X) is less than the other natural number (Y).

8. The battery system of claim 7, wherein the computation appliance in the battery management system selects values of the natural number (X) and the other natural number (Y) that are symmetrical about the mean value of the plurality of states of charge ($mean(SOC_i)$) of the plurality of (N) battery cells.

* * * * *